United States Patent [19]

Cohen et al.

[11] 4,286,046
[45] Aug. 25, 1981

[54] PROCESS FOR PREPARATION OF MULTICOLOR SURPRINT PROOFS WITH SILICA OVERCOAT

[75] Inventors: Abraham B. Cohen, Springfield; Roxy Fan, East Brunswick, both of N.J.

[73] Assignee: E. I. Du Pont de Nemours and Company, Wilmington, Del.

[21] Appl. No.: 45,245

[22] Filed: Jun. 4, 1979

[51] Int. Cl.$^3$ ................................................. G03C 5/00
[52] U.S. Cl. .................................. 430/272; 427/204; 427/214; 430/11; 430/14; 430/17; 430/18; 430/291; 430/293; 430/331; 430/950
[58] Field of Search ............... 430/12, 272, 291, 293, 430/324, 331, 950, 11, 14, 17, 18; 427/204, 214

[56] References Cited

U.S. PATENT DOCUMENTS

| | | | |
|---|---|---|---|
| 2,432,484 | 12/1947 | Moulton | 85/1 |
| 2,536,764 | 1/1951 | Moulton | 117/27 |
| 3,053,662 | 9/1962 | Mackey | 96/87 |
| 3,415,771 | 12/1968 | Woodruf | 260/33.4 |
| 3,649,268 | 3/1972 | Chu et al. | 96/27 R |
| 3,687,703 | 8/1972 | Ohashi et al. | 96/67 X |
| 4,126,460 | 11/1978 | Okishi | 430/300 |
| 4,174,216 | 11/1979 | Cohen et al. | 430/257 |

FOREIGN PATENT DOCUMENTS 692592  6/1953  United Kingdom .

Primary Examiner—Edward C. Kimlin

[57] ABSTRACT

Process for preparation of multicolor surprint proofs from a composite photoimaged element, e.g., photopolymer element, having, in order, a sheet support, at least two colored photoimaged elements, and a layer of colloidal silica applied thereon, said colloidal silica being coated from a substantially aqueous dispersion wherein the colloidal silica has an average particle diameter of less than 500 nm and wherein at least 75% of the solids of said dispersion are silica, the silica layer being at least 20 mg/dm$^2$ when dried. The multicolor proofs obtained contain a sharp image free from any three-dimensional effects and have a delustered, matte appearance which simulates printed press sheets.

12 Claims, No Drawings

PROCESS FOR PREPARATION OF MULTICOLOR SURPRINT PROOFS WITH SILICA OVERCOAT

DESCRIPTION

This invention relates to a process for preparing multicolor proofs and more particularly to a process wherein the multicolor proofs are of the surprint type prepared from colored photoimaged elements coated with an aqueous colloidal silica dispersion.

BACKGROUND ART

In the printing industry there is a need to have a quick and cheap method for proofing the color separation records prior to the preparation of the elements useful in a long-term and expensive printing process. Many techniques have been developed for providing pre-press color proofing systems to meet the need of the industry. One such color proofing system is the lamination of tacky photopolymer elements to a support such as paper and imaging of the tacky images by means of colorants. This system is positive-working. Another known color proofing system involves the use of photopolymer elements having sandwiched between a support and a removable cover sheet a nontonable photopolymerizable layer and a tonable, tacky elastomer coating composition. This system is negative-working. Other nonphotopolymerizable color proofing systems are known. Each of these pre-press color proofing systems closely matches the press sheet. The images produced in this manner generally are "nonplanar" and have a somewhat relief appearance. The image thus may appear slightly distorted or unsharp due to light diffraction from the nonplanar image. This distortion appears similar to a three-dimensional affect when viewed at a slight angle from the perpendicular. Additionally, these systems usually have a final layer of supported photopolymer applied to the multicolored proof which first serves to transparentize the toned image. The final layer is generally given an overall exposure to actinic radiation to harden the layer and serve as a protective shield for subsequent handling. The support for this final layer may or may not be removed at this point. The composite element so produced, even after removal of the protective support, will have a glossy appearance, which is sometimes objectionable because the printed page being proofed is not always glossy in nature. Desired matte finishes have been difficult to achieve. Sprays have been used containing delustering agents but are messy, involve hazardous, flammable sprays, often do not cover the layer properly, yield a poor matte finish, and the solvents may attack the image-forming layer.

The application of dry particulate matter to the upper photopolymer layer of a multicolor proof also has not been satisfactory. The particulate material is generally applied to a tacky photopolymer layer, and the layer is subsequently exposed by conventional methods, i.e., in a vacuum frame. Oil-absorptive particles have been applied to tacky photopolymer surfaces without need for an overall exposure step. Generally, these oil absorptive particles have an average diameter of about 1000 nm or more. Since particles of this size can sometimes cause a very high degree of matte finish, this can lead to some loss in image detail when employed over a nonplanar image. Application of smaller particles (e.g., below 500 nm average particle size, the colloidal region) is complicated by the fact that the smaller particles tend to agglomerate during the toning procedure and thus produce the same effects noted above. It is known to apply colloidal particles (e.g., colloidal silica) by coating a binder containing mixture directly over a planar imaged surface, for example. It is not possible, however, to achieve high loadings of colloidal silica by this method and the degree of matte and image quality may suffer.

It is desirable that an adherent matte finish be provided on the nonplanar surface of a multicolor proof surprint by a quick and easy method. Such process should eliminate any three-dimensional effects of the multilayer colored proof that may be present (improve image quality), and provide a hard, nonblocking surface to which other materials, e.g., paper, do not adhere.

DISCLOSURE OF THE INVENTION

In accordance with this invention there is provided a process for preparing a multicolor proof with improved image sharpness comprising a surprint having at least two nonplanar colored photoimaged elements on a support, the improvement comprising (a) coating on said photoimaged surprint at least one layer of colloidal silica from a substantially aqueous dispersion wherein the colloidal silica has an average particle diameter of less than 500 nm and at least 75% of the solids of said dispersion are silica, and (b) drying the layer to a dried coating weight of at least 20 mg/dm$^2$.

The nonplanar photoimaged elements most useful in forming the multicolor proofs of this invention are preferably composite photopolymer elements of the negative-working or positive-working types. It is understood, however, that other type nonsilver halide systems are useful in preparing the multicolor proofs, e.g., diazo systems, etc. The term "composite photopolymer element" means that on a suitable support surface, e.g., paper, film, etc., are consecutively laminated at least two negative-working or positive-working photopolymer elements that have been imaged and colored with different colorants. Optionally, a nonimaged negative-working or positive-working photopolymer element is applied to the outermost colored photoimaged element. Generally, the composite photopolymer element has over its support 4 imaged, colored photopolymer elements and an optional fifth nonimaged photopolymer element.

Useful photopolymer elements are known, the negative-working photopolymer elements being described in Cohen and Fan U.S. Ser. No. 915,063, filed June 12, 1978 now U.S. Pat. No. 4,174,216, and the positive-working photopolymer elements being described in U.S. Pat. No. 3,649,268. The negative-working elements comprise, in order, from top to bottom (1) a strippable cover sheet, (2) a photoadherent layer comprising a material with ethylenically unsaturated or benzophenone type groups, which is generally nontacky, (3) a tonable organic contiguous layer, e.g., a tacky, nonphotosensitive elastomeric layer which is tonable by application of particulate material, and optionally (4) a sheet support. The positive-working photopolymer elements comprise (1) a removable support, (2) a photohardenable or photopolymer layer containing at least one free radical initiated, chain propagating, addition polymerizable compound containing at least one terminal ethylenic group, and an addition polymerization initiator activatable by actinic radiation, and optionally a compatible macromolecular organic polymeric binder, and (3) a strippable cover sheet. When such elements are used to form the composite photopolymer element the cover sheet and any sheet support are removed. The negative-working element, therefore, has two layers, one of which is photopolymerizable, and the positive-working element has a single photopolymerizable layer. The multicolor proof prepared by the surprint method is described in the U.S. patents set forth above as well as in the examples which follow. Colorants and toners used in preparing multicolor proofs are described in U.S. Pat. Nos. 3,620,726, and 3,909,326.

Preferably, the desired matte finish is provided by applying to the outer nonplanar imaged and colored photopolymer layer of the composite photopolymer element or nonimaged photopolymer element, if present, at least one layer of substantially aqueous colloidal silica. Aqueous colloidal silica is commercially available, e.g., from E. I. duPont de Nemours and Company, Wilmington, Delaware under the trademark Ludox ® Colloidal Silica as well as other sources. It has been found that useful aqueous colloidal silica dispersions contain about 5 to about 60% or more by weight of silica solids, the particles having an average particle diameter of less than 500 nm. The remainder of the dispersion is water but may contain minor amounts of wetting agents or surfactants, e.g., in amounts up to about 1.0% based on the weight of total dispersion. Optionally, up to about 5% by weight based on the weight of total dispersion of water miscible organic solvents such as low molecular weight alcohol, e.g., methanol, ethanol, etc. can be present in the dispersion. Of the total solids present in the aqueous dispersion at least 75% by weight solids is silica. Up to 25% by weight of total solids can be at least one water-soluble binder, e.g., polyvinyl alcohol, polyvinyl pyrrolidone, etc. and/or water dispersible polymer emulsions, e.g., vinylidene chloride (65%)/methyl acrylate (7%)/itaconic acid (1.5%)/ethyl acrylate (26.5%), vinylidene chloride (85)/methyl acrylate (15)/itaconic acid (2), methyl methacrylate (65)/ethyl acrylate (25)/methacrylic acid (5), poly(methyl methacrylate), etc. The additional binders aid in improving the durability of the dried silica layer. A preferred range of silica solids in the aqueous dispersion is 10 to 50%. A preferred range of average particle diameter of the silica is 1 to 150 nm, more preferably 2 to 90 nm.

Useful wetting agents and surfactants include: sodium lauryl sulfate, potassium fluorinated alkyl carboxylates, e.g., potassium salt of N-ethyl, N-perfluorooctane-sulfonylglycine; sodium alkylaryl sulfonates, organic phosphates, aliphatic polyesters, octylphenoxy polyoxyethanol and polyoxyethylene sorbitan monolaurate, for example. Useful antifoaming agents include: G. E. Antifoam 60 silicone emulsion, General Electric Company, Schenectady, New York, Colloid 581B nonionic defoaming agent, Colloids, Inc., Newark, NJ, and Antifoam FD-82 silicone emulsion, Hodag Chem. Co., Skokie, IL, for example.

The aqueous colloidal silica is applied to the photoimaged surface by coating such as by wiping, e.g., with a saturated cloth, or by means of rollers or other devices known to those skilled in the art, e.g., doctor knife, wire rod, etc. A preferred coating method is described in Example 3 below wherein a bottom roll driven coater is used. As the multicolored proof (image side down) is passed through the nip of the rollers the aqueous colloidal silica dispersion is applied to the photoimaged surface. The coating is either allowed to air dry at ambient room conditions or is dried with a hot air blower. One or more applications of the aqueous colloidal silica can be used, with drying between each application. The dry thickness of the silica layer is at least 20 mg/dm$^2$, preferably 40 to 250 mg/dm$^2$. In general, the total process time for application of the required silica matte layer is short, e.g., about 5 minutes or less at ambient room temperature.

BEST MODE FOR CARRYING OUT THE INVENTION

The best mode for carrying out the process of this invention is illustrated in Example 5. The aqueous colloidal silica solution of Example 1 containing surfactant and antifoaming compounds is applied to the photopolymer surface over a four-color surprint using the roller coater as described in Example 3.

INDUSTRIAL APPLICABILITY

The process of this invention provides a quick method for preparing multicolor proofs from either negative-working or positive-working composite photoimaged elements, e.g., photopolymer elements, which closely simulate printed press proofs. The aqueous colloidal silica dispersion of the invention is applied to the outer layer of the composite photoimaged element; and upon drying, provides an adherent, uniform, hard matte finish thereon. Any three-dimensional effects that may be present in the multilayer colored proof due to the multilayer thickness and nonplanarity of the layers are eliminated which imparts improved sharpness to the proof. The multicolor proof surface is also nonblocking, i.e., the surface does not adhere to other surfaces such as paper during storate. When positive-working composite photopolymer elements are used to prepare the multicolor proof, the silica layer prevents reticulation of the proof, i.e., uneven deformation in the surface of the toned areas over a period of time. This effect is accentuated by heating.

EXAMPLES

The following examples illustrate the invention wherein the percentages are by weight. Examples 1 to 5, 7, 9 and 13 to 15 utilize a negative-working pre-press color proof of the surprint type prepared as follows:

I. Nontonable Photopolymerizable Layer

A coating solution of a photopolymerizable composition is prepared by mixing together the following ingredients:

| Ingredient | Weight (g) |
|---|---|
| Polymethyl methacrylate (MW 200,000 300,000) | 41.54 |
| Di-(3-acryloxy-2-hydroxypropyl) ether of Bisphenol-A | 51.86 |
| (2-Chlorophenyl-4,5-diphenyl imidazolyl) dimer | 2.20 |
| 2-(Stilbyl-4")-(naptho-1',2';4,5) 1,2,3-triazol-2"-sulfonic acid phenyl ester | 2.20 |
| 2-Mercapto-benzoxazole | 1.50 |
| Polyethylene oxide (MW 600,000) | 0.70 |
| Methanol | 20.70 |
| Methylene chloride | 323.70 |

This solution is coated at a coating weight of about 40 mg/dm$^2$ when dried on a clear polyethylene terephthalate film having a thickness of 0.0005 inch (0.0015 cm) which is surface treated by electrostatic discharge at 0.07 coulombs/ft$^2$ (0.093 coulombs/m$^2$).

II. Tonable, Tacky Elastomer Contiguous Layer

A coating solution is prepared by mixing together the following ingredients:

| Ingredient | Weight (g) |
| --- | --- |
| Random copolymer of styrene/butadiene (40/60) | 19.75 |
| Cis-polybutadiene (Mooney Viscosity 55-60) | 79.75 |
| Tetra-bis-[methylene 3-(3',5'-di-t-butyl-4'-hydroxyphenyl) propionate] methane | 0.50 |
| Methylene chloride to make | 1333.30 |

This solution is coated on polyethylene terephthalate film having a releasable layer of polydimethyl siloxane coated thereon to give a coating weight of about 125 mg/dm² when dried.

III. Laminating Procedure

The supported photopolymerizable layer (I) and the supported tonable, tacky elastomer contiguous layer (II) are laminated in surface-to-surface relationship at room temperature with a pressure of about 40 psi (2.81 kg/cm²).

IV. Operations for Preparation of a Surprint

The laminate (III) is further handled as follows:

The polyethylene terephthalate film with the siloxane release coating is stripped from the tonable, tacky layer and the resulting element is then laminated at 100° C. to a 0.0012 inch (0.003 cm) thick paper support (identified as Barta Paper, marketed by the Intermill Corporation, Belgium). The element is then exposed to a half-tone negative, minus-blue, color separation film record, the exposure being made through the electrostatic discharge treated, clear polyethylene terephthalate film. This exposure is about 30 seconds on an exposing device identified as a Berkey-Ascor Vacuum Printer, fitted with a photopolymer lamp (2 KW) and a Kokomo® glass filter (No. 400) Kokomo Opalescent Glass Co., Kokomo, IN. The distance between the lamp and the vacuum frame of this device is about 38 inches (96.52 cm). After the exposure is made, the exposed element is taped securely to a suitable flat surface, and the clear polyethylene terephthalate film cover sheet is stripped by pulling at one corner with an even, continuous motion at an angle of about 135°–180°. The resulting exposed, photopolymerized image photoadheres to the electrostatic discharge treated film and is removed with the film thus exposing equivalent areas of the tacky, elastomer contiguous layer on the paper support. The bared areas of the contiguous layer are toned using a yellow toner as described in Example 9 of U.S. Ser. No. 963,083 filed Nov. 22, 1978. A second laminate (III) having its polyethylene terephthalate film with release coating removed as described above is laminated to the surface of the yellow image and is exposed to a half-tone, negative, minus-green color separation film record in registration. The clear, surface treated polyethylene terephthalate film of the second laminate is stripped from the contiguous layer leaving bared an image which is toned with a magenta (red) toner as described above. The process is then repeated for the minus-red (blue toner) and black negative records. This procedure yields a four-color negative surprint proof. A number of these proofs are then prepared for the indicated examples.

Procedure (Control)

This procedure demonstrates the preparation of a control for comparison to the finish layers of this invention.

A laminate (III) as described above having its polyethylene terephthalate film with release coating stripped therefrom is laminated to the four-color negative surprint proof and the composite element formed is given an overall exposure with the clear polyethylene terephthalate film cover sheet in place to harden the photopolymerizable layer. This laminate (III) serves to transparentize the upper toned layer of the composite element and by exposure with the cover sheet in place also serves to protect the surprint proof. The image when viewed through the glossy polyethylene terephthalate layer has high artificial gloss, a three-dimensional effect, and does not have as sharp an image as a press sheet.

A known method for preparing a protective surface for the surprint is to laminate a laminate (III) over the four-color image and without exposure remove the clear polyethylene terephthalate film cover sheet therefrom. The image appears sharper than that described above because of the reduction in gloss caused by removal of the film; however, the layer only provides limited protection against other surfaces sticking thereto (blocking) under heat and/or pressure.

EXAMPLE 1

A four-color surprint prepared as described above is laminated with a laminate (III) having its release layer coated polyethylene terephthalate film removed and then the clear polyethylene terephthalate film cover sheet is removed therefrom. The photopolymer surface is wiped with an aqueous dispersion colloidal silica (Ludox® AM, E. I. duPont de Nemours and Company, Wilmington, Delaware) having an average particle diameter 12 nm, 30% solids, pH (25° C.) 8.9, viscosity (25° C.) cP 11.0, specific gravity (25° C.) 1.21, surface modified with aluminate ions. After wiping, the colloidal silica layer (dried thickness greater than 200 mg/dm² as solids) is hard and provides an excellent matte finish thereto. Surprisingly, the colloidal silica has excellent adhesion to the photopolymer layer. The image is sharp and there is no evidence of a three-dimensional effect. The image closely resembles a press sheet. The treated sample is then given an oven test, i.e., heated in an oven at 50° C. in contact with a sheet of blank Barta paper used as the surprint support. After heating for one day, the paper is easily removed from the matte covered, imaged surface without sticking.

EXAMPLE 2

Example 1 is repeated except that the aqueous colloidal silica solution is diluted to 15% solids, and a small amount of wetting agent (Triton® X-100, octylphenoxypolyethoxyethanol, Rohm and Haas, Philadelphia, Pennsylvania), 0.01% based on the weight of total dispersion, is added to improve the wetting characteristics. The aqueous colloidal silica dispersion is applied (two passes) with a squeegee wrapped with a lint-free cloth saturated with the aqueous colloidal silica dispersion. The silica layer is permitted to dry at ambient room temperature and pressure conditions providing an excellent surface (dried thickness about 60 mg/dm² as solids) with image quality comparable or better than that described in Example 1, including the blocking resistant properties.

EXAMPLE 3

The following aqueous colloidal silica dispersion is prepared:

| Ingredient | Weight (g) |
| --- | --- |
| Colloidal Silica (as described in Ex. 1) | 1000.0 |
| Duponol ®ME (sodium lauryl sulfate, E. I. du Pont de Nemours and Company, Wilmington, Delaware, 10% aqueous solution) | 30.0 |
| FC-128 (potassium fluorinated alkyl carboxylate, 3M Co., Minneapolis, Minn., 10% aqueous solution) | 10.0 |

This dispersion is mixed and applied (two passes, air drying between passes) to the surprint surface of the four-color proof to achieve a coating weight of about 69 mg/dm$^2$ (as solids). The application of the aqueous colloidal silica is made using a Bottom-Roll Coater (Western Litho Plate and Supply Co., Los Angeles, California). This coater (bottom-roll driver) is rolled at 10 ft/min. (25.4 cm/min.). The rollers are set to provide a minimum of nip pressure without play in the rolls. An excellent image is obtained with properties as described in Example 2.

EXAMPLE 4

Three aqueous dispersions using 750 g of aqueous colloidal silica dispersions (Ludox ® TM, E. I. duPont de Nemours and Company, Wilmington, Delaware), having an average particle diameter 21 nm, pH (25° C.) 9.0, viscosity (25° C.) cP 35.0, specific gravity (25° C.) 1.40, each containing 22.5 ml of Duponol ®ME surfactant (10% solution) and 7.5 ml FC-128 (10% solution) surfactants described in Example 3, and additionally 6.2 ml G. E. Antifoam 60, General Electric Company (1% solution) are prepared as follows:

| Dispersion | Solids (%) | Dried Coating Wt. (mg/dm$^2$ solids) | Water (ml) |
| --- | --- | --- | --- |
| A | 50 | 100 | — |
| B | 40 | 80 | 190 |
| C | 30 | 69 | 500 |

Each of the dispersions is coated as described in Example 3 on the photopolymer surface over the surprint. All dispersions, when dry, give excellent results. The coating with higher percent solids gives a higher level of matte.

EXAMPLE 5

To the aqueous colloidal silica dispersion as described in Example 1 is added small amounts of two surfactants as described in Example 3 and in Example 4 and G. E. Antifoam 60 (General Electric Co.) is added as described in Example 4. Ethanol (4% on total dispersion) is also added. The pH of this dispersion is adjusted to 7.0 with 3 N H$_2$SO$_4$. This dispersion is applied in two passes through the roller coater described in Example 3 to the photopolymer surface over the four-color surprint. The dry silica overcoat (75 mg/dm$^2$ as solids) provides a streak-free matte finish, sharp image quality with no observable three-dimensional effect and exhibits no blocking in the oven test described in Example 1.

EXAMPLE 6

Two four-color surprint photopolymer elements are prepared as previously described above except that the paper support described in step IV is replaced by clear polyethylene terephthalate film (about 0.004 inch (0.10 mm) thick). Sample A is similar to the control described above and results in a glossy transparency having an unsharp three-dimensional image. In Sample B (the invention), after lamination of a fifth laminate (III) and removal of the cover sheet of polyethylene terephthalate, the aqueous colloidal silica dispersion described in Example 5 is applied thereon. This sample possesses excellent image quality, and the resulting translucent matte surface eliminates the three-dimensional effect noted in the control sample (A).

EXAMPLE 7

Example 5 is repeated except that after the cover sheet is removed from the surprint, the photopolymer surface is given an overall exposure to harden it. The aqueous colloidal silica dispersion is then applied three times through the coater with an equivalent image being obtained indicating that good adherence to the surface is obtained even after polymerization by exposure. The dried coating weight as solids is about 85 mg/dm$^2$.

EXAMPLE 8

Positive-working photopolymerizable elements are prepared as described in Example I of U.S. Pat. No. 3,649,268 and are used to make a four-color positive proof as described in that Example. A fifth photopolymerizable element is laminated over the four-color proof, is given a nonimagewise exposure, and the polyethylene terephthalate cover sheet is removed by stripping. The aqueous colloidal silica dispersion of Example 5 is coated on this element (3 passes through the roller coater) yielding a high quality, positive proof having a good matte finish which simulates the appearance of a press sheet. A control (no colloidal silica treatment) has a high glossy surface. The positive print with the colloidal silica coating also exhibits no reticulation (image deformation) after 16 hours in an oven at 50° C. The control has high reticulation, a defect which is not desirable. Surprisingly, the use of aqueous colloidal silica prevents reticulation. The colloidal silica layer (after air drying) exhibits excellent adherence to the hydrophobic polymer area. Dried coating weight as solids is about 85 mg/dm$^2$.

EXAMPLE 9

Several negative, four-color surprint proofs are prepared as described above. These surprint proofs are treated as follows:

Procedure A (Control)—A control is prepared as described above.

Procedure B—A fifth layer of tacky, positive photopolymer (see Example 8) is laminated over the surprint image. The cover sheet is removed and the tacky layer is toned with cellulose acetate (~4000 nm average particle diameter) to impart a matte finish.

Procedure C—Procedure B is repeated except that talcum powder (~6000 nm particle diameter) is applied to impart a matte finish.

Procedure D—The surprint of Example 5 is prepared.

Although surprints made by procedures B, C, and D have matte finishes, the surprints of Procedure B and C give poor details. Only the surprint prepared by Procedure D of this invention gives a clear, sharp image.

EXAMPLE 10

A four-color positive proof is made as described in Example 8. A fifth photopolymerizable element is then laminated over the image and the polyethylene terephthalate cover sheet is removed by stripping. This still tacky layer is coated with the aqueous colloidal silica dispersion of Example 5 (2 passes through the roller coater) yielding a high quality, positive proof having a good matte finish which simulates the appearance of a press sheet. The surface is free of tack and eminently suitable for further handling. If further improvement in surface toughness is desired, the layer may be hardened by overall exposure.

EXAMPLE 11

Two four-color positive proofs are made as described in Example 8. A fifth photopolymerizable element is then laminated over the image and the polyethylene terephthalate cover sheet is removed by stripping. Dry, hydrophilic silica particles are applied to the surface using standard, toning procedures. The following results are obtained.

| Sample | Average Silica Particle Diameter | Results |
|---|---|---|
| A | 14 nm[(1)] | Poor finish; incomplete matte |
| B | 15 nm[(2)] | Poor finish; incomplete matte |

[(1)]Quoso ®G-32, Philadelphia Quartz Co., Philadelphia, PA
[(2)]Quoso ®WR-50, Philadelphia Quartz Co., Philadelphia, PA This example demonstrates that it is necessary to apply the silica in an aqueous colloidal state in order to achieve an overall matte finish.

EXAMPLE 12

In order to demonstrate the utility of this invention with other photoimaging systems, a four-color, diazo negative-working washout system furnished by 3M Company, St. Paul, MN ("TRANS-KEY") is used according to the directions supplied therewith to prepare a four-color surprint proof. The surprint is coated with the dispersion of Example 3, as described in that example. A high quality, matte finish is achieved.

EXAMPLE 13

Samples of negative, four-color surprint proofs are prepared as described above. An aqueous colloidal silica dispersion is prepared as described in Example 3 and divided into four aliquots. Various water dispersible polymer emulsions are added as shown below. In each case, the ratio of colloidal silica to polymer (solid basis) is 75:25. Samples of the surprints are coated with these dispersions as indicated using the procedures of Example 3 with the following results:

| Sample | Water Dispersible Polymer |
|---|---|
| A | None (control) |
| B | Vinylidene chloride (65%)/ methyl acrylate (7%)/ itaconic acid (1.5%)/ ethyl acrylate (26.5%); See U.S. Pat. No. 3,443,950 |
| C | Vinylidene chloride (85)/ methyl methacrylate (15)/ itaconic acid(2)* |
| D | Methyl methacrylate (65)/ ethylacrylate (25)/ methacrylic acid (5)* |
| E | Polymerized methyl methacrylate (Rohplex ®B-85, Rohm & Haas Co., Philadelphia, PA) |

*parts by weight

The control surprint exhibits a high gloss, unsharp image. The surprints coated with the silica/polymer emulsion dispersions exhibit good matte and sharp image.

EXAMPLE 14

Samples of negative four-color surprint proofs are prepared as described above. An aqueous colloidal silica dispersion is prepared as described in Example 3 and divided into three aliquots. Various water soluble polymers are added as shown below at the ratio of silica to polymer as shown (based on solids). Samples of the surprints are coated with the indicated dispersions using the procedures of Example 3.

| Sample | Water Soluble Polymer | Silica:Polymer Ratio |
|---|---|---|
| A | None (control) | — |
| B | Polyvinylpyrrolidone | 90:10 |
| C | Polyvinylpyrrolidine (60)/vinyl acetate (40) copolymer* | 90:10 |
| D | Polyvinyl alcohol/polyethylene bead mixture | 85:12.5:2.5 |

*parts by weight

The control surprint has a high gloss, unsharp image. The surprints coated with the silica/water soluble polymer dispersion exhibit good matte and good sharp image.

EXAMPLE 15

The following aqueous colloidal silica dispersion is prepared:

| Ingredient | Weight (g) |
|---|---|
| Colloidal silica (as described in Ex. 1) | 1000.0 |
| Duponol ®ME (sodium lauryl sulfate, E. I. du Pont de Nemours and Company, Wilmington, Delaware, 10% aqueous solution) | 30.0 |
| FC-128 (potassium fluorinated alkyl carboxylate, 3M Co., Minneapolis, MN, 10% aqueous solution) | 30.0 |

This dispersion is coated as described in Example 3 directly over the four-color negative surprint proof prepared as described above except that the nonimaged photopolymer element is not present. Good matte and good image quality is achieved which demonstrates the versatility of the matte finish layer of this invention when applied over a nonplanar photoimaged surface.

We claim:

1. In a process for preparing a multicolor proof with improved image sharpness comprising a surprint having at least two nonplanar, nonsilver halide colored photoimaged elements on a support, the improvement comprising (a) coating on said photoimaged surprint at least one layer of colloidal silica from a substantially aqueous dispersion containing colloidal silica particles in a range of 10 to 60% by weight of solids wherein the colloidal silica has an average particle diameter of less than 500 nm and at least 75% of the solids of said dispersion are silica, and (b) drying the layer to a dried coating weight of at least 20 mg/dm$^2$.

2. A process according to claim 1 wherein the photoimaged elements are photopolymer elements.

3. A process according to claim 2 wherein a nonimaged photopolymer element is present as the outer element of said proof.

4. A process according to claims 1 or 2 or 3 wherein the aqueous colloidal silica solution contains at least one wetting agent or surfactant.

5. A process according to claim 4 wherein the aqueous colloidal silica solution contains an antifoaming agent.

6. A process according to claims 1 or 2 or 3 wherein the aqueous colloidal silica layer is coated by rollers.

7. A process according to claim 3 wherein the nonimaged photopolymer element consists essentially of a layer comprising a nontacky photohardenable material with ethylenically unsaturated or benzophenone type groups and a contiguous layer of a nonphotosensitive tacky organic material.

8. A process according to claim 3 wherein the nonimaged photopolymer element is a layer containing at least one free radical initiated, chain propagating, addition polymerizable compound containing at least one terminal ethylenic group, and an addition polymerization initiator activatable by actinic radiation.

9. A process according to claim 8 wherein said photopolymer layer is nontacky.

10. A process according to claim 3 wherein the sheet support bears four colored imaged photopolymer elements and the aqueous colloidal silica coated on the surface of the nonimaged photopolymer element has an average particle diameter of 2 to 90 nm and is dried to a dried coating weight of 40 mg/dm$^2$ to 250 mg/dm$^2$.

11. A process according to claim 1 wherein the aqueous dispersion contains up to 25% of total solids of at least one water soluble binder.

12. A process according to claim 1 wherein the aqueous dispersion contains up to 25% of total solids of a water dispersible polymer emulsion.

* * * * *